(12) United States Patent
Yamanouchi et al.

(10) Patent No.: US 8,508,101 B2
(45) Date of Patent: Aug. 13, 2013

(54) ELASTIC BOUNDARY WAVE SUBSTRATE AND ELASTIC BOUNDARY WAVE FUNCTIONAL ELEMENT USING THE SUBSTRATE

(75) Inventors: Kazuhiko Yamanouchi, Miyagi (JP); Yusuke Satoh, Miyagi (JP)

(73) Assignee: Panasonic Corporation, Osaka (JP)

( * ) Notice: Subject to any disclaimer, the term of this patent is extended or adjusted under 35 U.S.C. 154(b) by 271 days.

(21) Appl. No.: 12/601,687

(22) PCT Filed: May 28, 2008

(86) PCT No.: PCT/JP2008/001329
§ 371 (c)(1),
(2), (4) Date: Nov. 24, 2009

(87) PCT Pub. No.: WO2008/146489
PCT Pub. Date: Dec. 4, 2008

(65) Prior Publication Data
US 2010/0171389 A1    Jul. 8, 2010

(30) Foreign Application Priority Data

May 28, 2007  (JP) ................................ 2007-166939
Mar. 9, 2008   (JP) ................................ 2008-098723

(51) Int. Cl.
*H01L 41/04*  (2006.01)

(52) U.S. Cl.
USPC ............... 310/313 A; 310/313 R; 310/313 B; 310/313 C; 310/313 D

(58) Field of Classification Search
USPC .................. 310/313 R, 313 A, 313 B, 313 C, 310/313 D
See application file for complete search history.

(56) References Cited

U.S. PATENT DOCUMENTS 5,111,100 A * 5/1992 Noguchi et al. .......... 310/313 A
5,914,645 A * 6/1999 Kobayashi et al. ........... 333/193
(Continued)

FOREIGN PATENT DOCUMENTS

| JP | 2006-279609 | 10/2006 |
| WO | 98/52279 | 11/1998 |
| WO | 2005/093949 | 10/2005 |
| WO | 2006/114930 | 11/2006 |

OTHER PUBLICATIONS

Yusuke Satoh, and Kazuhiko Yamanouchi, "Piezoelectric Acoustic Boundary Waves in the Structure of 2-Layer thin films/Electrode/Piezoelectric Substrate", Tohoku Institute of Technology, 2007 Autumn Meeting Acoustical Society of Japan, University of Yamanashi, Kofu Sep. 19-21, 2007, pp. 1171 and 1172, published Sep. 12, 2007.

(Continued)

*Primary Examiner* — Thomas Dougherty
*Assistant Examiner* — Bryan Gordon
(74) *Attorney, Agent, or Firm* — Greenblum & Berstein, P.L.C.

(57) ABSTRACT

The structure of the patent is a substrate wherein a metal electrode, a dielectric thin film, and a further dielectric thin film are adhered onto a piezoelectric substrate. A substrate wherein elastic wave energy is confined in the piezoelectric substrate can be obtained. In particular, when a $SiO_2$ thin film and an AlN thin film are used as thin films 4 and 5, respectively, a substrate excellent in an electromechanical coupling coefficient ($k^2$) and a temperature characteristic of frequency can be yielded by making the film thicknesses of electrodes 2 and 3 and those of the thin films 4 and 5 into optimal values.

4 Claims, 11 Drawing Sheets

(56) References Cited

U.S. PATENT DOCUMENTS

| | | | |
|---|---|---|---|
| 7,151,424 B2* | 12/2006 | Kando | 333/193 |
| 7,213,314 B2* | 5/2007 | Abbott et al. | 29/25.35 |
| 7,327,069 B2* | 2/2008 | Chen | 310/313 R |
| 7,446,453 B1* | 11/2008 | Naumenko et al. | 310/313 A |
| 2006/0220494 A1* | 10/2006 | Miura et al. | 310/313 D |
| 2007/0018536 A1* | 1/2007 | Kadota et al. | 310/322 |
| 2009/0115287 A1 | 5/2009 | Kando | |

OTHER PUBLICATIONS

Kazuhiko Yamanouchi and Yusuke Satoh, "New Piezoelectric Acoustic Boundary Waves in the Structure of Multi-Layer Thin Films/ Electrode/Piezoelectric Substrates", Tohoku Institute of Technology, The Institute of Electronics, Information and Communication Engineers Technical Report, vol. 107, No. 232, pp. 23-28, along with an English language Abstract, Sep. 20, 2007.

Kazuhiko Yamanouchi and Yusuke Satoh, "New Piezoelectric Acoustic Boundary Waves in the Structure of Multi-Layer Thin Films/ Electrode/Piezoelectric Substrates", Tohoku Institute of Technology, Japan Society for the Promotion of Science, pp. 27, 28, 30 and 32, Oct. 11, 2007.

Yusuke Satoh and Kazuhiko Yamanouchi, "New Piezoelectric Acoustic Boundary Waves in the Structure of Multi-Layer Thin Films/Electrode/Piezoelectric Substrates", Tohoku Institute of Technology, Proceedings of Symposium on Ultrasonic Electronics, vol. 28, pp. 157-158, along with an English language Abstract, Nov. 14-16, 2007.

R. Stoneley, "Elastic Waves at the Surface of Separation of Two Solids", Proc. R. Soc. Lond. A., 106, pp. 416-428, 1924.

K. Yamanouchi, K. Iwahashi and K. Shibayama, "Piezoelectric Acoustic Boundary Waves Propagating Along the Interface Between $SiO_2$ and $LiTaO_3$", IEEE Transactions on Sonics and Ultrasonics, vol. SU-25, No. 6, pp. 384-389, 1978.

International Search Report issued with respect to PCT/JP2008/ 001329, mailed Aug. 26, 2008.

International Preliminary Report on Patentability issued Jan. 12, 2010 with respect to PCT/JP2008/001329.

* cited by examiner

ELASTIC BOUNDARY WAVE SUBSTRATE AND ELASTIC BOUNDARY WAVE FUNCTIONAL ELEMENT USING THE SUBSTRATE

BACKGROUND OF THE INVENTION

1. Technical Field

The present invention relates to an elastic boundary wave substrate on which energy is concentrated into a substrate surface thereof and an electrode section, so as to be propagated, and an elastic boundary wave functional element using the substrate.

2. Background Art

Elastic surface wave filters and elastic surface wave functional elements each using an elastic surface wave converter wherein an interdigital electrode is set on a piezoelectric substrate are widely used as intermediate frequency band filters for television or filters for mobile communication. In these filters, an elastic surface wave is used; thus, their surface for propagating and receiving the elastic surface wave and their propagation path surface need to be made free. Thus, these filters are each required to be packaged. In the meantime, by use of an elastic boundary wave, the energy of which is confined in a substrate, a functional element for which no package is necessary can be attained. A first research article wherein an elastic boundary wave is analyzed is R. Stoneley: R. Soc. Proc. London Ser. A., 106 (1924) 416. An article on a combination of a piezoelectric substrate with a thin film is K. Yamanouchi, K. Iwahashi and K. Shibayama, "Piezoelectric Boundary Waves along the Interface between $SiO_2$ and $LiTaO_3$", IEEE Transactions Sonics and Ultrasonics, Vol. SU-25, No. 6, 1978, pp. 384-389. According to this article, only a monolayered thin film is used so that conditions for trapping a boundary wave into a boundary are strict. As a result, the combination has not been put into practical use.

The present patent has been made in order to overcome these drawbacks.

SUMMARY OF THE INVENTION

For any filter using an elastic surface wave, a package is required for putting its propagating and receiving electrode section and its propagation path into the condition that their surfaces are made free. Thus, there is caused a drawback that the element becomes somewhat large. An object of the patent is to provide a small-sized element by confining elastic wave energy into a substrate.

In the present patent, a substrate is formed so as to have a structure wherein a metal electrode, a dielectric thin film and a further dielectric thin film are adhered onto a piezoelectric substrate. An object of the patent is to obtain, in such a manner, a substrate which neither radiates energy to its piezoelectric substrate nor produces displacement in its thin film surface, and which gives a large electromechanical coupling coefficient and an excellent temperature characteristic of frequency (TCF).

BRIEF DESCRIPTION OF THE DRAWINGS

The present invention will become readily understood from the following description of preferred embodiments thereof made with reference to the accompanying drawings, in which like parts are designated by like reference numeral and in which.

DETAILED DESCRIPTION OF THE PREFERRED EMBODIMENTS

Example 1

Figure 1:
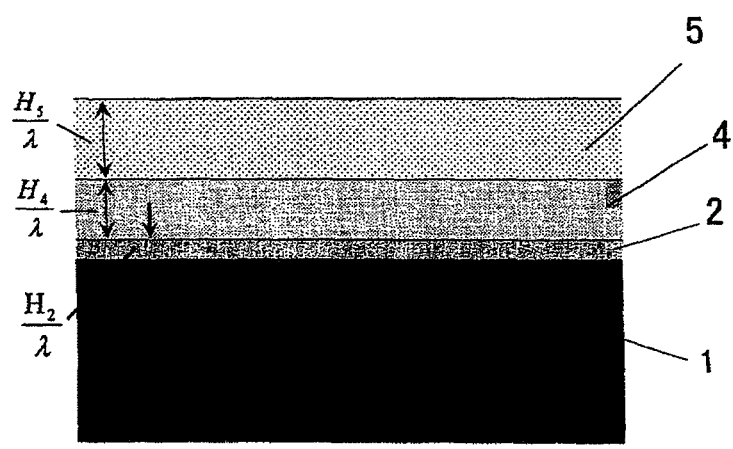
FIG. 1 is a sectional view of an elastic boundary wave substrate having a metal thin film 2.
Figure 2:
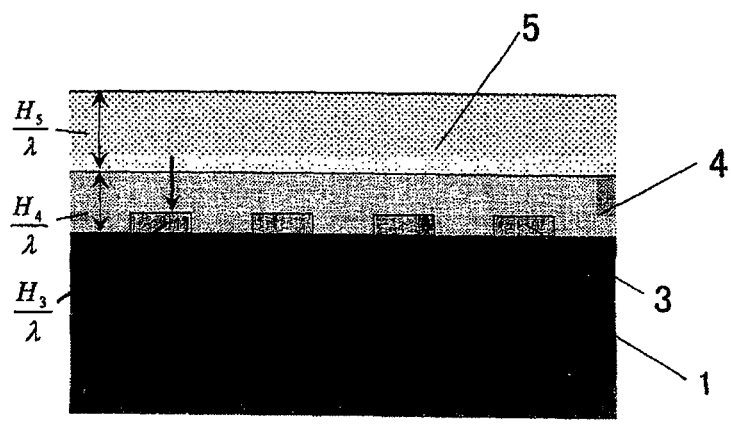
FIG. 2 is a sectional view of an elastic boundary wave substrate having an interdigital electrode 3.
Figure 3:
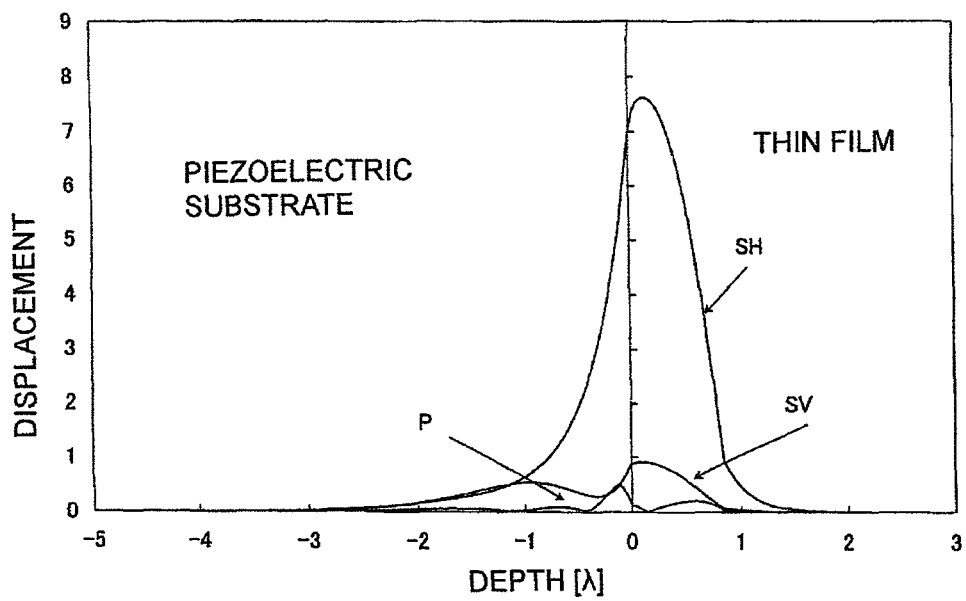
FIG. 3 shows displacement distributions of a substrate having an $AlN/SiO_2/Al/Y$—X $LiNbO_3$ structure, wherein SH, SV and P represent the displacement parallel to its plane, the displacement perpendicular thereto, and the displacement in the propagation direction, respectively.

As illustrated in FIGS. 1 and 2, example 1 is an elastic boundary wave substrate, comprising a piezoelectric or electrostrictive substrate 1, or a piezoelectric thin-film substrate 1 wherein a piezoelectric thin film is adhered onto a substrate as illustrated in FIG. 1 or 2, a metal film 2 or an interdigital electrode 3 adhered onto the substrate 1 as illustrated in FIG. 3, a dielectric thin film or piezoelectric thin film 4 thereon, and a dielectric thin film 5, piezoelectric thin film 5 or metal thin film 5 adhered thereonto, and having a structure wherein elastic wave energy is concentrated into the vicinity of the boundary surface between the surface of the substrate 1 and the metal film 2 or the interdigital electrode 3, energy radiation in the thickness direction of the substrate is zero, and the energy (displacement) of the surface of the thin film 5 is zero, a structure wherein the energy of a part of the whole is radiated to the substrate, or a structure wherein a part of the energy (displacement) of the whole is present also in the surface of the thin film 5; and a functional element using the elastic boundary wave substrate.

Example 2

Example 2 is the elastic boundary wave substrate, and the functional element using the elastic boundary wave substrate according to claim 1, having a structure wherein the energy radiation in the thickness direction of the substrate is ⅛ or less of the energy of the whole, and the energy of the surface of the thin film 5 is ⅛ or less of the energy of the whole.

Example 3

Example 3 is the elastic boundary wave substrate, and the functional element using the elastic boundary wave substrate according to claim 1 or 2, having a structure wherein the piezoelectric or electrostrictive substrate or piezoelectric thin-film substrate of the substrate 1 is 120-136° rotated Y—X propagation LINbO$_3$, −10 to 90° rotated Y—X propagation LiNbO$_3$, Y—Z LiNbO$_3$, 25-55° rotated Y—X propagation LiTaO$_3$, X-112°Y LiTaO$_3$, 0-90° rotated Y—X propagation KNbO$_3$, langasite, lithium tetraborate, quartz crystal, BGO, BSO, ZnO/substrate, AlN/substrate, AlN/Si, or ZnO/Si, and is a substrate having a propagation axis in the range of ±50° in connection with the propagation direction of the substrate, the dielectric thin film 4 or piezoelectric thin film 4 is a TeO$_2$ thin film and a Te$_x$O$_y$ thin film, a SiO$_2$ thin film and a Si$_x$O$_y$ thin film, a HfO$_2$ thin film, a BGO thin film, a BGS thin film, a LINbO$_3$ thin film, a LiTaO$_3$ thin film, a Ta$_2$O$_5$ thin film, a ZnO thin film, an AlN film, an Al$_2$O$_3$ thin film, or a glass thin film, the dielectric thin film 5, piezoelectric thin film 5 or metal thin film 5 is a SiO$_2$ thin film, an AlN thin film, an Al$_2$O$_3$ thin film, a diamond film, a SiC thin film, a Si3N4 thin film, a LiNbO$_3$ thin film, a LiTaO$_3$ thin film, a beryllium metal thin film, Si, a dielectric thin film, piezoelectric thin film or metal/semiconductor thin film having a larger transverse wave velocity than that of the dielectric thin film 4.

Example 4

Example 4 is the elastic boundary wave substrate, and the functional element using the elastic boundary wave substrate according to claim 1, 2 or 3, having a structure wherein the metal thin film 2 or the electrode film 3 is an Al thin film, a Cu thin film, a Au thin film, a Ag thin film, a Mo thin film, a W thin film, a Rh thin film, a Pt thin film, a Pb thin film, and an alloy thereof.

Example 5

Figure 21:
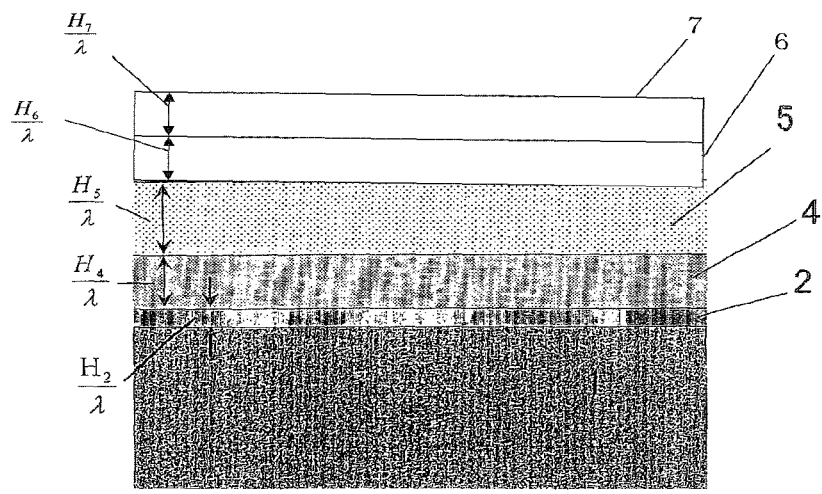
FIG. 21 shows a sectional view of an elastic boundary wave substrate having a metal thin film 2, thin film 6, and thin film 7.

Example 5 is the elastic boundary wave substrate, and the functional element using the elastic boundary wave substrate according to claim 1, 2, 3 or 4, having a structure wherein plural thin films, such as the thin film 6 and thin film 7, are adhered onto the thin film 5, or having a structure wherein thin films are used in the manner that the transverse wave velocities of (the) thin films 6 to N are larger than the transverse wave velocity of the thin film 4 (see, e.g., FIG. 21).

Example 6

Example 6 is the elastic boundary wave substrate, and the functional element using the elastic boundary wave substrate according to claim 1, 2, 3, 4 or 5, having a structure wherein the thin film 4 is a SiO$_2$ thin film or thin film made of glass or the like, this thin film having a temperature characteristic of frequency reverse to that of the substrate, the thin film 5 is an AlN thin film, Al$_2$O$_3$ thin film or SiC thin film, the metal film 2 or the electrode film 3 is an Al thin film, Cu thin film, Au thin film, or Ag thin film, and the piezoelectric substrate 1 is a −10 to 70° rotated Y—X propagation LiNbO$_3$ substrate, or a 30 to 60° rotated Y—X propagation LiTaO$_3$ substrate.

Example 7

Example 7 is the elastic boundary wave substrate, and the functional element using the elastic boundary wave substrate according to claim 1, 2, 3, 4, 5 or 6, wherein when the wavelength of the central frequency of the boundary wave is represented by λ and the film thickness of the metal electrode film 2 or 3 is represented by $H_2/\lambda$ or $H_3/\lambda$, respectively, the value thereof ranges from 0.005 to 0.25; when the film thickness of the dielectric film 4 is represented by $H_4/\lambda$, the value thereof ranges from 0.005 to 3.5; when the film thickness of the dielectric film 5 is represented by $H_5/\lambda$, the value thereof ranges from 0.005 to 3.5; and the film thickness of the thin films over the thin film 5 is represented by $H_{6-N}/\lambda$, the value thereof ranges from 0.00 to 3.5.

Example 8

Example 8 is the elastic boundary wave substrate, and the functional element using the elastic boundary wave substrate according to claim 1, 2, 3, 4, 5, 6 or 7, wherein a thin film 11 having a smaller transverse wave velocity than that of the thin film 4 and having a film thickness ratio $H_{sd}/\lambda$ of 0.005 to 0.200 is adhered onto between the metal film 2 or the interdigital electrode 3 and the thin film 4, and further the thin film 4, the thin film 5 and the thin films $H_6$—N are adhered thereonto, or the thin film 11 has a grating structure.

Example 9

Example 9 is the elastic boundary wave substrate, and the functional element using the elastic boundary wave substrate according to claim 1, 2, 3, 4, 5, 6, 7 or 8, wherein a thin film 22 having a larger transverse wave velocity than that of the thin film 4 and having a film thickness ratio $H_{hd}/\lambda$ of 0.005 to 0.200 is adhered onto between the metal film 2 or the interdigital electrode 3 and the thin film 4, and further the thin film 4, the thin film 5 and (the) thin films $H_{6-N}$ are adhered thereonto, or the thin film 11 has a grating structure.

Example 10

Example 10 is the elastic boundary wave substrate, and the functional element using the elastic boundary wave substrate according to claim 1, 2, 3, 4, 5, 6, 7, 8 or 9, wherein a thin film 33 having a larger transverse wave velocity than that of the thin film 4 and having a film thickness ratio $H_{hd}/\lambda$ of 0.005 to 0.200 is adhered onto between the metal film 2 or the interdigital electrode 3 and the thin film 4, and further the thin film 4 is adhered thereonto, or the thin film 11 has a grating structure.

Example 11

Example 11 is the elastic boundary wave substrate, and the functional element using the elastic boundary wave substrate according to claim 1, 2, 3, 4, 5, 6, 7, 8, 9 or 10, having a structure wherein the process for producing the thin film 4, the thin film 5, (the) thin films $H_{6-N}$, and the thin films 11, 22 and 33 is a resistance-heating vapor deposition process, a sputtering process, a process of applying a solution to the surface of the substrate by spin-coating, and then subjecting the applied solution to thermal decomposition, thereby producing target one of the thin films, or an MOCVD process.

Example 12

Example 12 is the elastic boundary wave substrate, and the functional element using the elastic boundary wave substrate according to claim 1, 2, 3, 4, 5, 6, 7, 8, 9, 10 or 11, having a structure wherein the structure of the electrode 3 is a resonator having a reflecting electrode, an interdigital electrode resonator, a unidirectional interdigital electrode, or a distributed type interdigital electrode.

EFFECTS OF THE INVENTION

Figure 4:
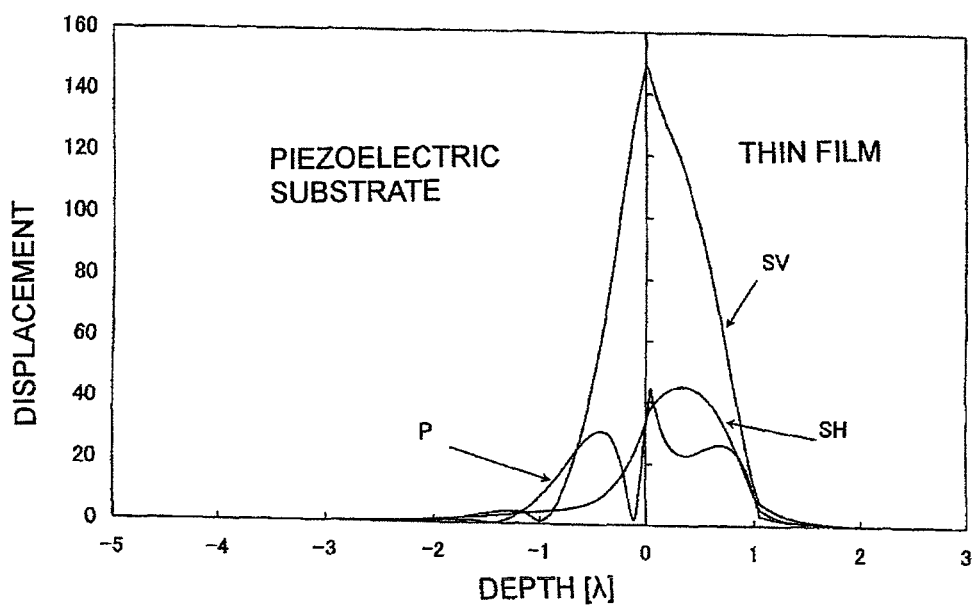
FIG. 4 shows displacement distributions of a substrate having an $AlN/SiO_2/Cu/128°$ Y—X $LiNbO_3$ structure.

FIG. 3 shows displacement distributions of a substrate having an Al/SiO$_2$/Al/Y—X LiNbO$_3$ structure as an example of the above-mentioned substrates. In the figure, the respective film thicknesses are as follows: $H_2/\lambda$=0.05, $H_4/\lambda$=0.8, and $H_5/\lambda$=2.0. In this case, characteristics that the electromechanical coupling coefficient $k^2$=0.10 and the temperature characteristic of frequency (TCF)=−7 ppm/° C. are obtained. It is understood that energy is concentrated to the electrode section and the thin film section on the substrate. FIG. 4 shows displacement distributions of a substrate having an AlN/SiO$_2$/Cu/128° Y—X LiNbO$_3$ structure. In the figure, $H_2$, $H_3/\lambda$=0.05, $H_4/\lambda$=1.0, and $H_5/\lambda$=2.0. In this case, characteristics that $k^2$=0.055 and the temperature characteristic of frequency (TCF)=−22 ppm/° C. are obtained. It is understood from the figure that energy is concentrated to the electrode section and the thin film section on the substrate.

Figure 5:
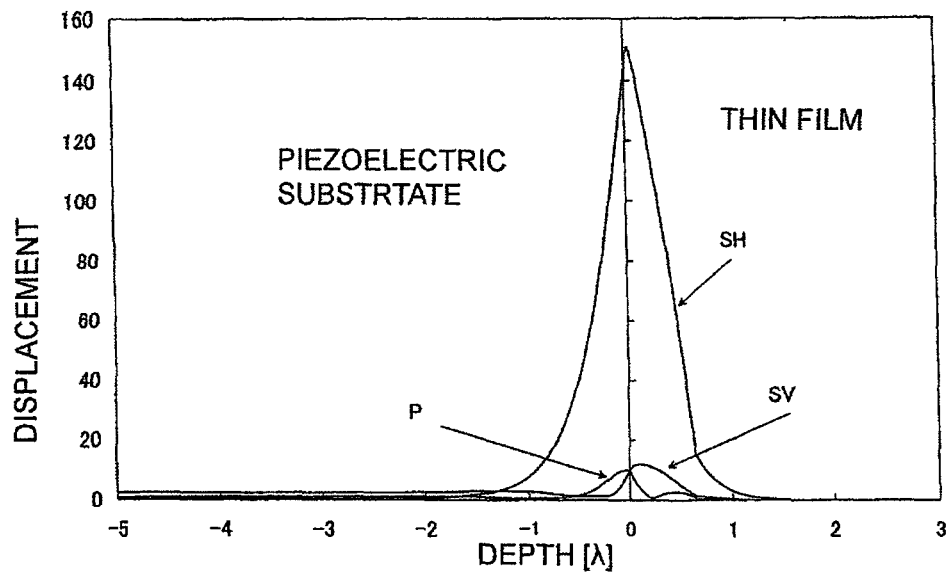
FIG. 5 shows displacement distributions of a substrate having an $AlN/SiO_2/Cu/36°$ Y—X $LiTaO_3$ structure.

FIG. 5 shows displacement distributions of a substrate having an AlN/SiO$_2$/Cu/36° Y—X LiTaO$_3$ structure. In the figure, $H_2$, $H_3/\lambda$=0.05, $H_4/\lambda$=0.6, and $H_5/\lambda$=1.5 to 2.0. In this case, characteristics that $k^2$=0.056 and the temperature characteristic of frequency (TCF)=−0 ppm/° C. are obtained. It is understood from the figure that energy is concentrated to the electrode section and the thin film section on the substrate.

Figure 6:
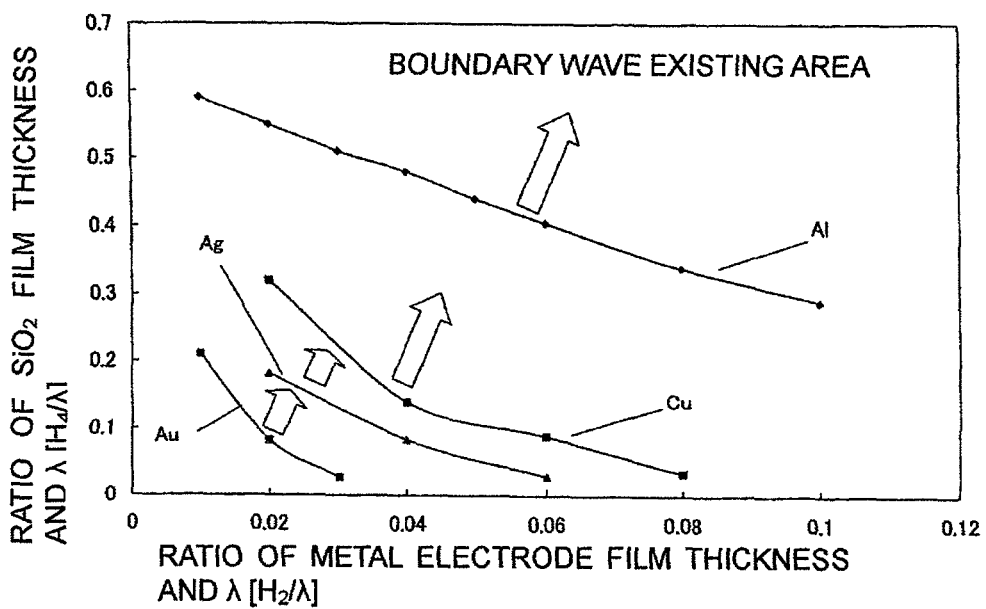
FIG. 6 shows each existing area of an elastic boundary wave relative to the thickness of an electrode film and the thickness of a $SiO_2$ film, wherein the directions of arrows each show a area where the elastic boundary wave exists.

FIG. 6 is a chart showing an area where an elastic boundary wave exists in an AlN/SiO$_2$/each of Al, Cu, Ag and Au/Y—X LiNbO$_3$ substrate. The electrode of each of Au, Ag, Cu and Al is used as a parameter, the transverse axis represents the electrode film thickness ratio $H_2/\lambda$ or $H_3/\lambda$, and the vertical axis represents the SiO$_2$ film thickness ratio $H_4/\lambda$. FIG. 6 shows each curve showing the existing area when the ratio $H_5/\lambda$ of AlN film thickness and $\lambda$ is set into the range of 1.0 to 2.0. The direction of each arrow in the figure shows a area where an elastic boundary wave exists. In the case of, for example, the Al electrode, it is shown that under the condition that $H_2/\lambda$ is 0.05, an elastic boundary wave area exists when the ratio $H_4/\lambda$ of SiO$_2$ film thickness and $\lambda$ is 0.45 or more.

Figure 7:
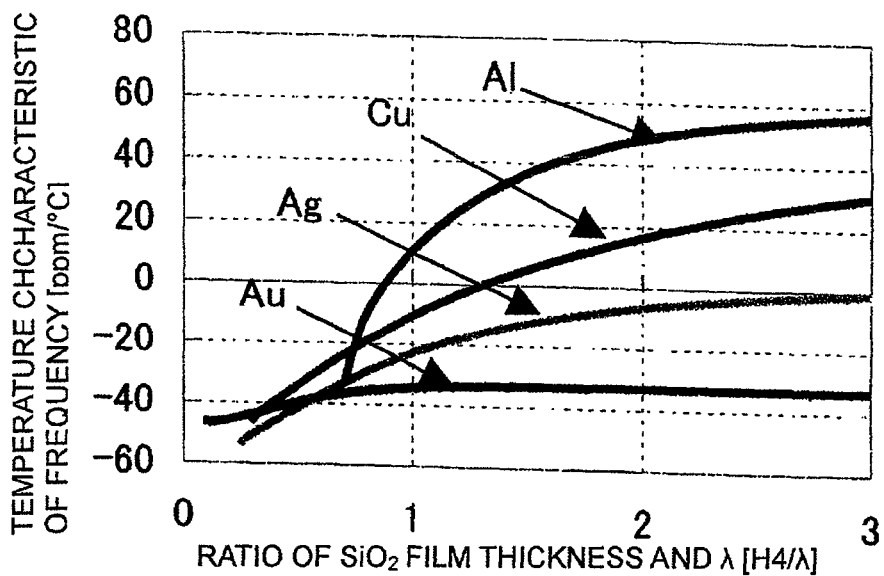
FIG. 7 shows each temperature characteristic of frequency of an elastic boundary wave relative to the thickness of a $SiO_2$ film.

When an AlN thin film where $H_5/\lambda$ is from 1.0 to 2.0 is used, as the thin film 5, for a metal of an AlN/SiO$_2$/electrode/ Y—X LiNbO$_3$ substrate where the electrode film thickness $H_2$, $H_3/\lambda$ is 0.05, the kind of the metal being various, the temperature characteristic of frequency (TCF) relative to the film thickness ratio $H_4/\lambda$ of the SiO$_2$ thin film is shown in FIG. 7. It is understood from the figure that about Au, zero frequency temperature-characteristic is not obtained while about the Cu electrode, a zero frequency temperature-characteristic is obtained when the SiO$_2$ film $H_4/\lambda$ is 1.2. The results are obtained when each of Al, Cu, Ag and Au is used as the electrode film and SiO$_2$ and AlN films are used as the dielectric films. However, the same boundary wave is obtained in a case where the transverse wave velocity of the thin film 5 is larger than that of the thin film 4. Thus, the case is also in the present patent.

In the above-mentioned example, analysis was made on the boundary wave in a case where the film thickness ratio $H_5/\lambda$ of the topmost thin film AlN is sufficiently large, which is from 1.0 to 2.0; for a practical device, however, required is a device where the film thickness of the topmost area, which is to be a boundary wave, is as small as possible. Shown are analysis results and experimental results of the minimum film thickness that permits a boundary wave to exist in the range recited as the film thickness of the topmost area in claim 7, that is, in the range of $H_5/\lambda$ from 0.005 to 3.5.

Figure 8:
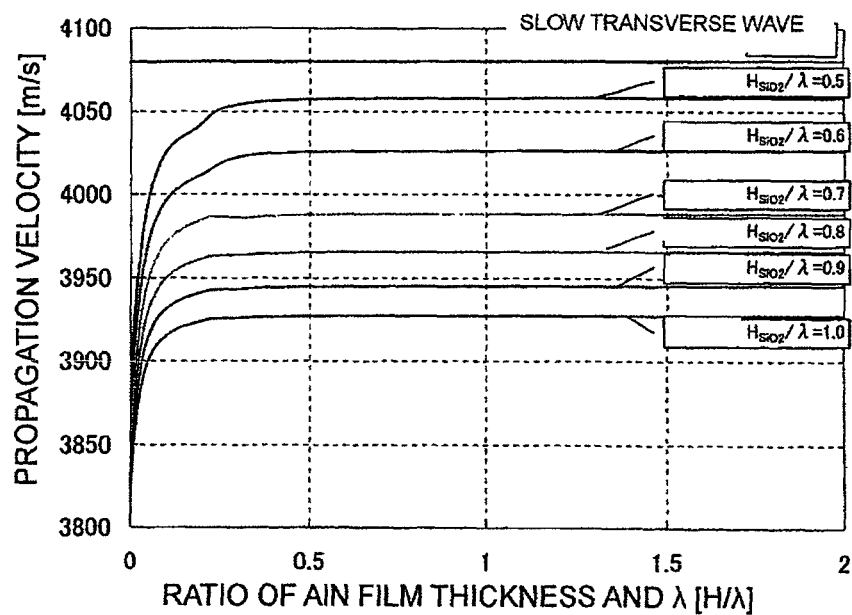
FIG. 8 shows, in an $AlN/SiO_2/Al/Y$—X $LiNbO_3$ substrate, each change in the propagation velocity relative to the ratio (H/$\lambda$) of AlN film thickness and $\lambda$ when $H_{Al}/\lambda$ is 0.05.

FIG. 8 is a chart showing, in an AlN/SiO$_2$/Al/Y—X LiNbO$_3$ substrate, each change in the propagation velocity relative to the AlN film thickness when $H_{Al}/\lambda$ is 0.05. In a case where the SiO$_2$ film thickness ratio $H_{SiO2}/\lambda$ is about 0.4 or less, a area where a change in the propagation velocity relative to a change in the AlN film thickness is constant is not present in a area smaller than the slow transverse wave, and thus no boundary wave exists; in a case where the SiO$_2$ film thickness $H_{SiO2}/\lambda$ is 0.5 or more, an area where a change in the propagation velocity relative to a change in the AlN film thickness is substantially constant is present when the film thickness ratio $H_{AlN}/\lambda$ is 0.5 or more, and thus a boundary wave exists; and an AlN film 0.5 or more in $H_{AlN}/\lambda$ is unnecessary. Besides these matters, a matter that a thick film is adhered onto the topmost area produces an adverse effect on the substrate, for example, the boundary wave substrate is cracked or the topmost film is cracked or peeled. Therefore, when $H_{AlN}/\lambda$ is set to 0.5, which is as small a value as possible, an optimal substrate is obtained.

Figure 9:
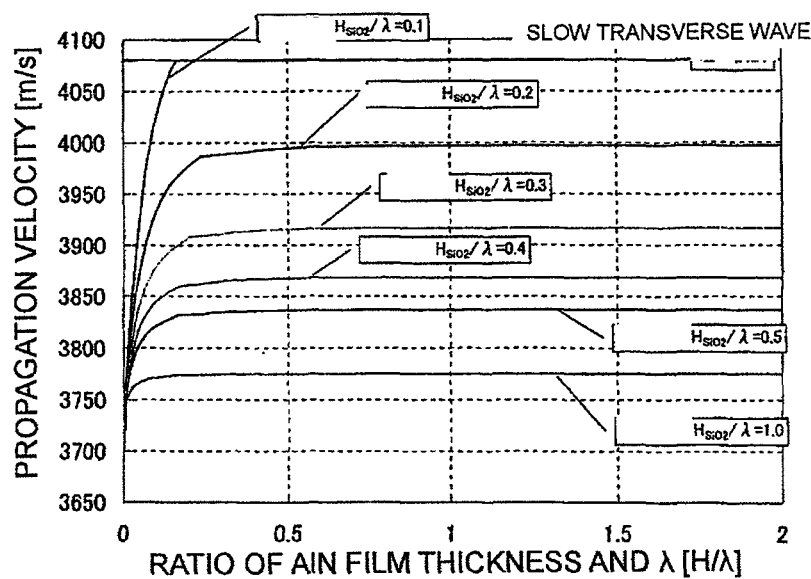
FIG. 9 shows, in an $AlN/SiO_2/Cu/Y$—X $LiNbO_3$ substrate, each change in the propagation velocity relative to the ratio (H/$\lambda$) of AlN film thickness and $\lambda$ when $H_{Cu}/\lambda$ is 0.04.

FIG. 9 shows, in an AlN/SiO$_2$/Cu/Y—X LiNbO$_3$ substrate, each change in the propagation velocity relative to the AlN film thickness when $H_{Cu}/\lambda$ is 0.04. In a case where the SiO$_2$ film thickness ratio $H_{SiO2}/\lambda$ is about 0.15 or less, no boundary wave exists; and in a case where the SiO$_2$ film thickness ratio $H_{SiO2}/\lambda$ is 0.2 or more, a change in the propagation velocity relative to $H_{Cu}/\lambda$ is hardly caused when the film thickness ratio $H_{AlN}/\lambda$ is 0.4 or more, so that a boundary wave is generated and thus an AlN film with $H_{AlN}/\lambda$ of 0.4 or more is unnecessary. Besides these matters, a matter that a thick film is adhered produces an adverse effect on the substrate, for example, the boundary wave substrate is cracked or the topmost film is cracked or peeled. Therefore, when HA is set to 0.4, which is as small a value as possible, an optimal substrate is obtained.

Figure 10:
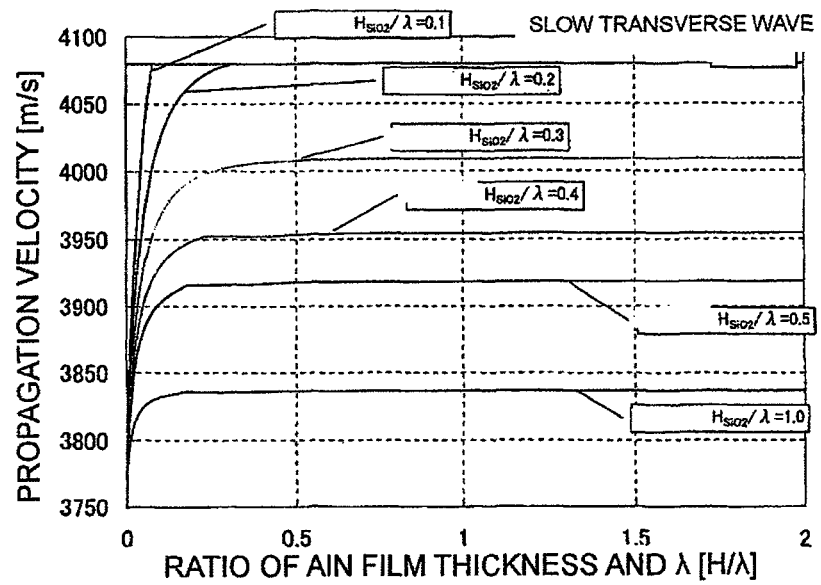
FIG. 10 shows, in an $AlN/SiO_2/Cu/10°$ Y—X $LiNbO_3$ substrate, each change in the propagation velocity relative to the ratio (H/$\lambda$) of AlN film thickness and $\lambda$ when $H_{Cu}/\lambda$ is 0.03.

FIG. 10 shows, in an AlN/SiO$_2$/Cu/10° Y—X LiNbO$_3$ substrate, each change in the propagation velocity relative to the AlN film thickness when H$_{Cu}$/λ is 0.03. In a case where the SiO$_2$ film thickness ratio H$_{SiO2}$/λ is about 0.25 or less, no boundary wave exists; and in a case where the SiO$_2$ film thickness ratio H$_{SiO2}$/λ is about 0.35 or more, a change in the propagation velocity relative to a change in the film thickness ratio H$_{AlN}$/λ is hardly caused when the film thickness ratio H$_{AlN}$/λ is 0.45 or more, so that a boundary wave is generated and thus an AlN film 0.5 or more in H$_{AlN}$/λ is unnecessary. Besides these matters, a matter that a thick film is adhered produces an adverse effect on the substrate, for example, the boundary wave substrate is cracked or the topmost film is cracked or peeled. Therefore, when H/λ is set to 0.5, which is as small a value as possible, an optimal substrate is obtained.

Figure 11:
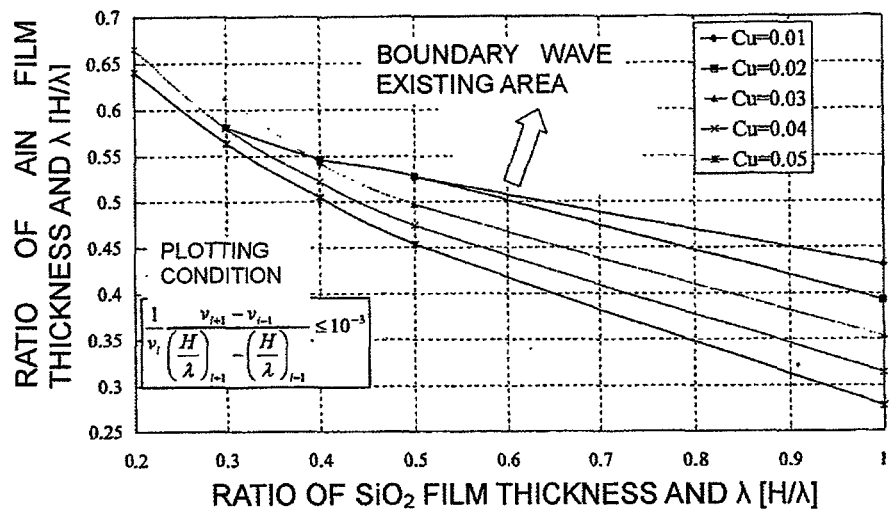
FIG. 11 shows, in an $AlN/SiO_2/Cu/Y$—X $LiNbO_3$ substrate, each minimum value of the film thickness of the topmost film AlN relative to the $SiO_2$ thin film in order to obtain a boundary wave in the substrate.

FIG. 11 shows, about an AlN/SiO$_2$/Cu/Y—X LiNbO$_3$ substrate, each minimum value of the topmost AlN film relative to the SiO$_2$ film thickness for obtaining a boundary wave, or each relationship between AlN and the SiO$_2$ minimum film thicknesses for obtaining a boundary wave in the substrate, using H$_{Cu}$/λ (the expression "Cu=0.1" in the figure corresponds to "H$_{Cu}$/λ=0.1") as a parameter, when the condition for obtaining the boundary wave is rendered a condition as shown as a plotting condition, that is, when the value of a change in the velocity (v$_{i+1}$−v$_i$)/v$_i$ relative to a change in the AlN film (H$_i$/λ−H$_{i+1}$/λ) is set to 10$^{−3}$. The figure shows that a boundary wave exists above the curve. When the SiO$_2$ film thickness ratio H$_{SiO2}$/λ and the H$_{Cu}$/λCu are, for example, 0.5 and 0.05, respectively, it is shown that a range where H$_{AlN}$/λ is 0.45 or more is a range where a boundary wave exists.

Figure 12:
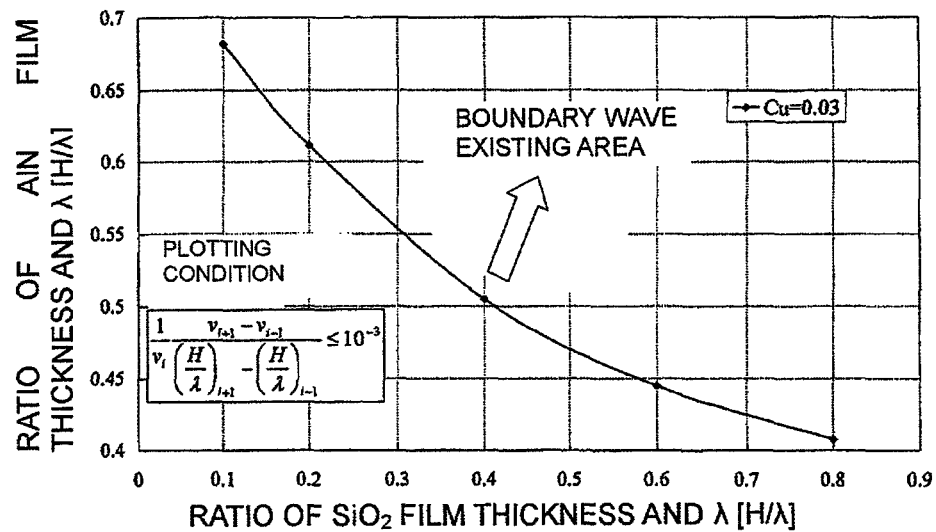
FIG. 12 shows, in an $AlN/SiO_2/Cu/36°$ Y—X $LiTaO_3$ substrate, a minimum value of the film thickness of the topmost film AlN relative to the $SiO_2$ thin film in order to obtain a boundary wave in the substrate.

FIG. 12 shows, about an AlN/SiO$_2$/Cu/36° Y—X LiTaO$_3$ substrate, each minimum value of the topmost AlN film relative to the SiO$_2$ film thickness for obtaining a boundary wave, or each relationship between AlN and the SiO$_2$ minimum film thicknesses for obtaining a boundary wave in the substrate, using H$_{Cu}$/λ (the expression "Cu=0.3" in the figure corresponds to "H$_{Cu}$/λ=0.375") as a parameter when the condition for obtaining the boundary wave is rendered a condition as shown as a plotting condition, that is, when the value of a change in the velocity (v$_{i+1}$−v$_i$)/v$_i$ relative to a change in the AlN film (H$_i$/λ−H$_{i+1}$/λ) is set to 10$^{−3}$. The figure shows that a boundary wave exists above the curve. When the SiO$_2$ film thickness ratio H$_{SiO2}$/λ and the H$_{Cu}$/λ$_{Cu}$ are, for example, 0.4 and 0.0.0375, respectively, it is shown that a range where H$_{AlN}$/λ is 0.5 or more is a range where a boundary wave exists.

Figure 13:
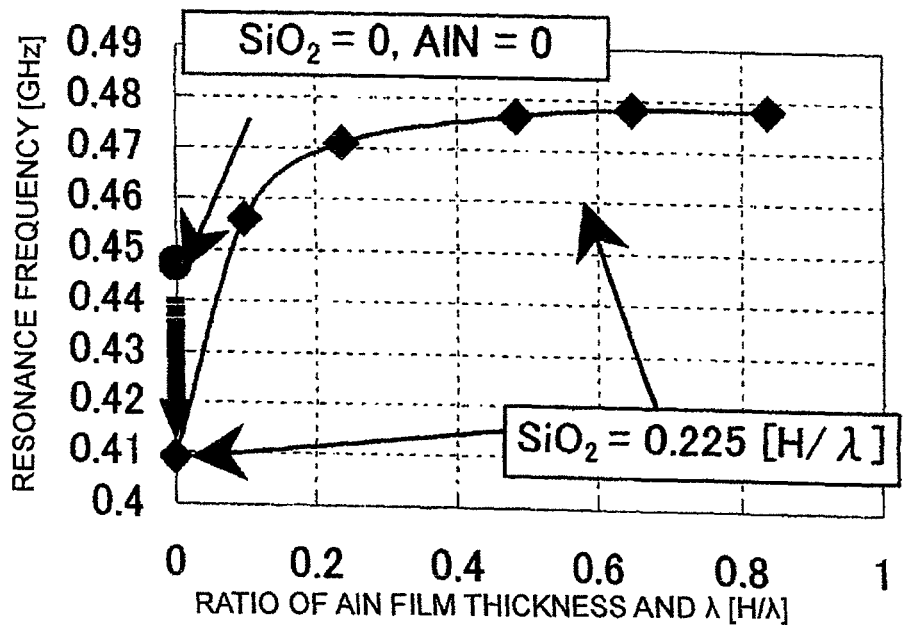
FIG. 13 is a chart showing a change in the resonance frequency of an $AlN/SiO_2/Cu$ electrode/Y—X $LiNbO_3$ substrate resonator relative to the thickness of the AlN film.

FIG. 13 shows experimental results of a resonator using an AlN/SiO$_2$/Cu electrode/Y—X LiNbO$_3$ substrate, and shows a change in the resonance central frequency when Cu with H$_3$/λ of 0.04 is used as the electrode 3, SiO$_2$ with H$_4$/λ of 0.225 is adhered as the thin film 4 thereon, an AlN thin film is adhered as the thin film 5 thereon and further the film thickness ratio H$_5$/λ is being made larger. It is understood that when H$_5$/λ is 0.5 or more, the central frequency is hardly changed and the displacement of the AlN surface is substantially zero so that an elastic boundary wave is generated.

Figure 14:
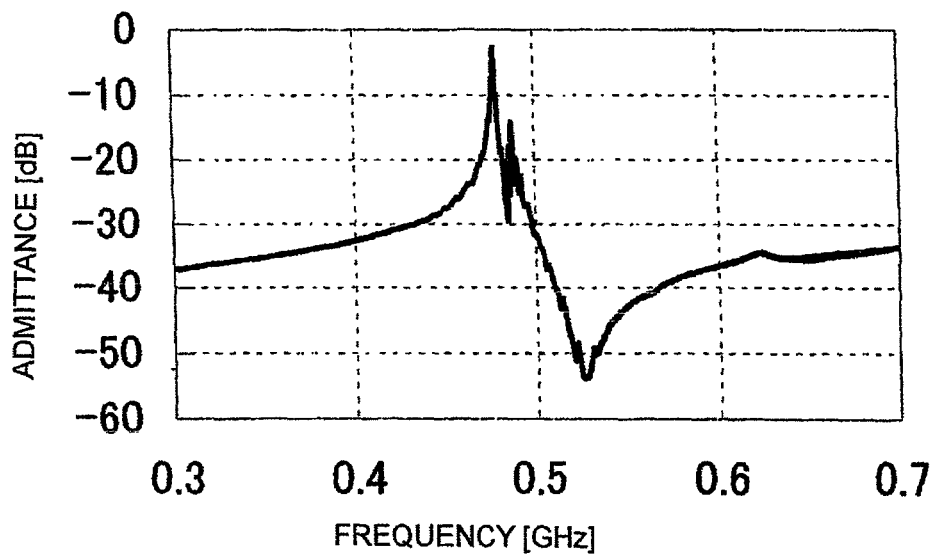
FIG. 14 shows the admittance characteristic of the $AlN/SiO_2/Cu$ electrode/Y—X $LiNbO_3$ substrate resonator.

FIG. 14 shows the frequency characteristic of the admittance of the elastic boundary wave resonator shown in FIG. 13.

It is understood from the figure that a good resonance characteristic is obtained. No characteristic change is caused even when a resist large in propagation attenuation is adhered onto the AlN surface.

Figure 15:
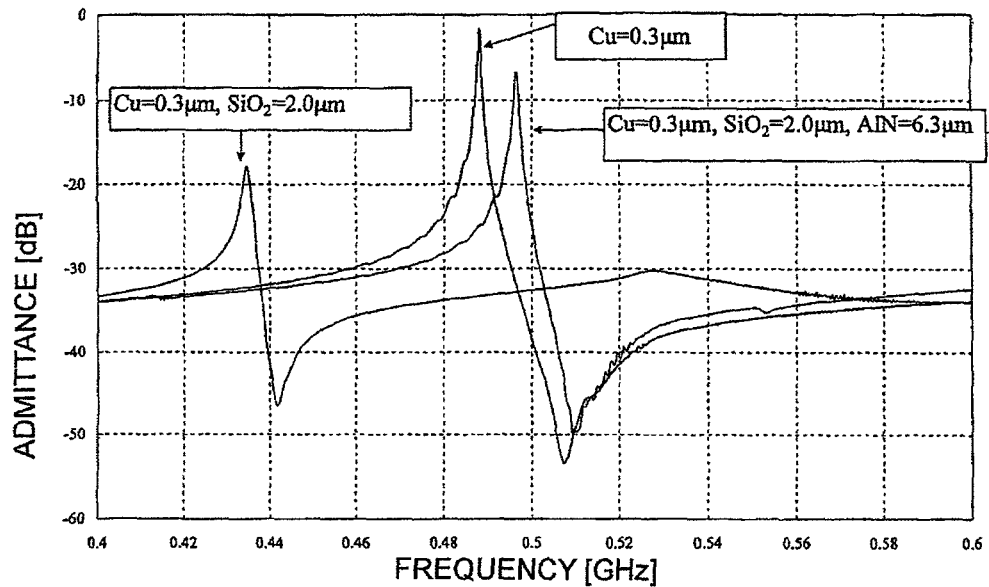
FIG. 15 shows each admittance characteristic of an $AlN/SiO_2/Cu$ electrode 36° Y—X $LiTaO_3$ substrate resonator.

FIG. 15 shows experimental results of a resonator using an AlN/SiO$_2$/Cu electrode 36° Y—X LiTaO$_3$ substrate, and shows the frequency characteristic of the admittance when Cu with H$_3$/λ of 0.037 is used as the electrode 3, SiO$_2$ with H$_4$/λ of 0.25 is adhered as the thin film 4 thereon, an AlN thin film is adhered as the thin film 5 thereon and further the film thickness ratio H$_5$/λ is being made larger. A change relationship is hardly generated between the characteristic of the case of adhering a photoresist film large in propagation loss, into a thickness of 3 μm, onto the surface of the substrate with H$_{AlN}$/λ of 0.78 (AlN=6.3 μm) and that of the case of not adhering the same photoresist film; therefore, it is understood that in the topmost area surface, a boundary wave which hardly gives a displacement is generated. It is understood that in this case also, the film thickness of the topmost area is sufficient, that is, H$_{AlN}$/λ is 0.78. In the case of this substrate, an unnecessary wave is hardly generated; thus, according to a rotated Y—X LiTaO$_3$ substrate, such a good filter characteristic that an unnecessary wave is not generated can easily be obtained.

Figure 16:
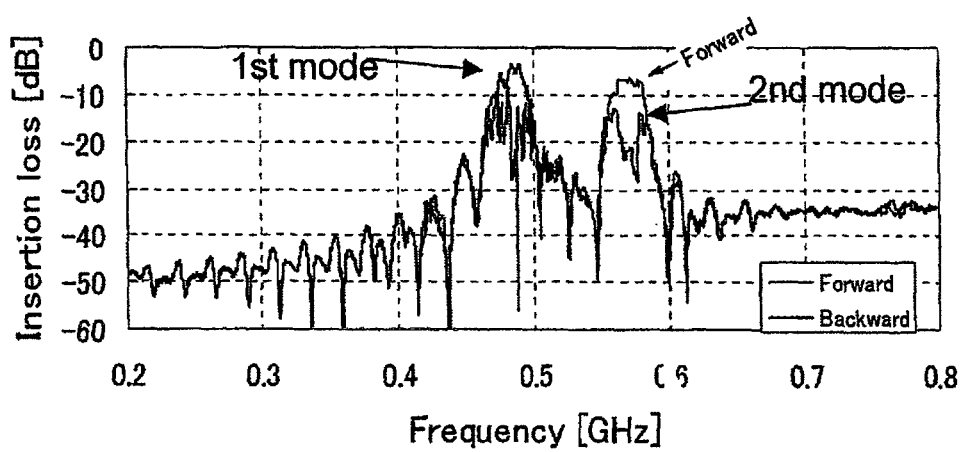
FIG. 16 shows the unidirectional filter characteristic of an $AlN/SiO_2/Te/Cu$ electrode/Y—X $LiNbO_3$ substrate.

FIG. 16 shows experimental results of a unidirectional filter interdigital electrode filter using a TeO$_2$ thin filter λ/4 grating thin-film reflector. Its substrate has an AlN/SiO$_2$/TeO$_2$ grating thin film/Y—X LiNbO$_3$ structure, and the AlN thin film, the SiO$_2$ film thickness, and the Cu electrode film thickness are 5.6λ, 0.3λ and 0.03λ, respectively. Thus, a good unidirectional characteristic and a low loss characteristic are obtained.

Figure 17:
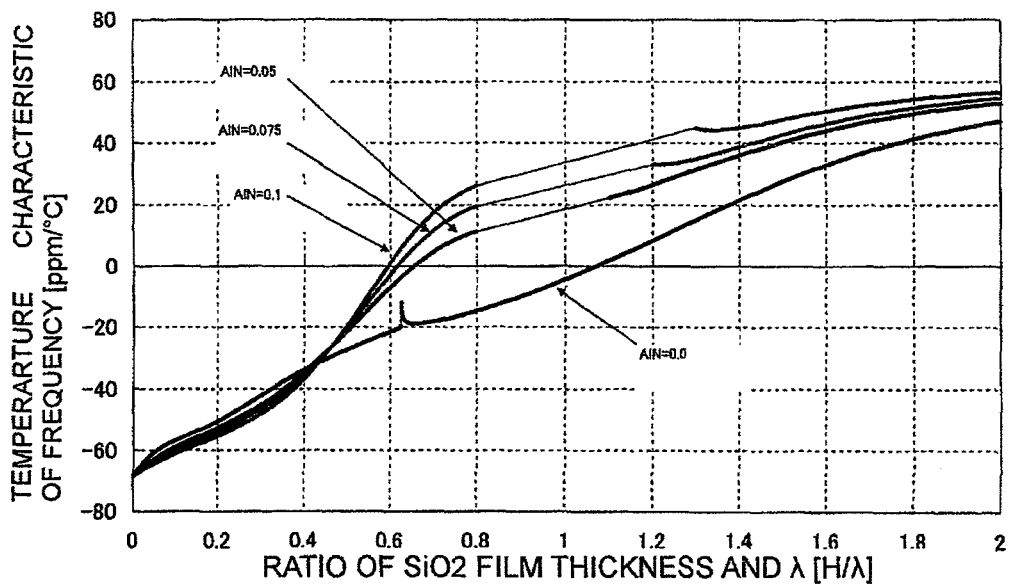
FIG. 17 shows each temperature characteristic of frequency of an $AlN/SiO_2/AlN/electrode/Y$—X $LiNbO_3$ substrate.

FIG. 17 shows each temperature characteristic of the frequency of a boundary wave in a case where: in connection with claim 10, electrode films 2 and 3 are adhered onto the substrate 1 in a rotated Y—X propagation manner; an AlN thin film 22 having a larger transverse wave velocity than that of the thin film 4, wherein H$_{hs}$/λ as a parameter is set to each of values 0.0, 0.05, 0.075 and 0.1, is adhered thereon; a SiO$_2$ thin film is adhered thereon to set H/λ into the range of 0 to 2.0; and an AlN film is adhered thereon to set H/λ to 1.5. It is understood that the SiO$_2$ film thickness at which a zero frequency temperature-characteristic is obtained can be obtained at a half of the value in a case where the AlN 22 is zero.

The above has described the case of using AlN as the thin film larger in transverse wave velocity than the thin film 4; however, when various thin films larger in transverse wave velocity than the thin film 4 are used, the same results are obtained. Thus, combination of different thin films are also included in the present patent.

Figure 18:
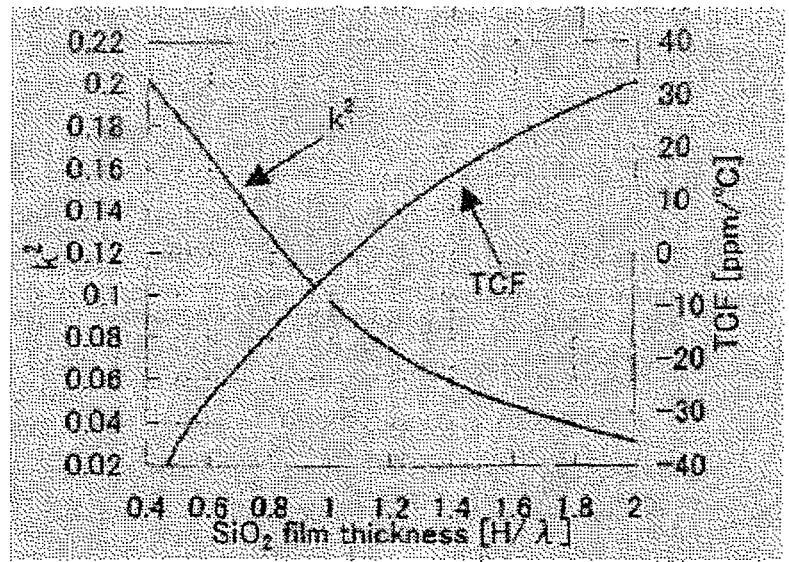
FIG. 18 shows simulation results of the electromechanical coupling coefficient $k^2$ and the temperature characteristic of frequency (TCF) when $H_2$, $H_3/\lambda=0.02$, $H_5/\lambda=2.0$ and $H_4$ is changed in $AlN/SiO_2/Cu/Y$—X $LiNbO_3$.

FIG. 18 shows simulation results of the electromechanical coupling coefficient k$^2$ and the temperature characteristic of frequency (TCF) when H$_2$, H$_3$/λ=0.02, H$_5$/λ=2.0 and H$_4$ is changed in AlN/SiO$_2$/Cu/Y—X LiNbO$_3$. It is understood that the film thickness ratio H$_4$/λ when the TCF is zero is 1.05 and the electromechanical coupling coefficient k$^2$ at this time is about 0.09.

Figure 19:
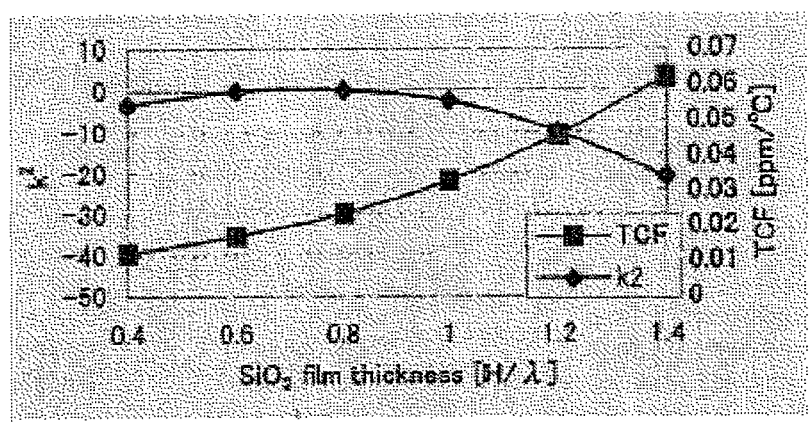
FIG. 19 shows simulation results of the electromechanical coupling coefficient $k^2$ and the temperature characteristic of frequency (TCF) when $H_2$, $H_3/\lambda=0.05$, $H_5/\lambda=2.0$ and $H_4$ is changed in $AlN/SiO_2/Cu/128°$ Y—X $LiNbO_3$.

FIG. 19 shows simulation results of the electromechanical coupling coefficient k$^2$ and the temperature characteristic of frequency (TCF) when H$_2$, H$_3$/λ=0.05, H$_5$/λ=2.0 and H$_4$ is changed in AlN/SiO$_2$/Cu/128° Y—X LiNbO$_3$. It is understood that the film thickness ratio H$_4$/λ when the TCF is zero is 1.35 and the electromechanical coupling coefficient k$^2$ at this time is about 0.035.

Figure 20:
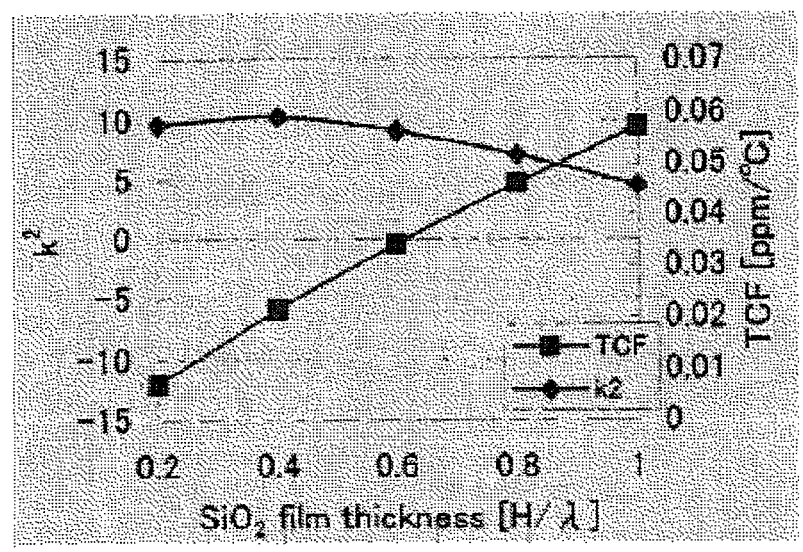
FIG. 20 shows simulation results of the electromechanical coupling coefficient $k^2$ and the temperature characteristic of frequency (TCF) when $H_2$, $H_3/\lambda=0.05$, $H_5/\lambda=2.0$ and $H_4$ is changed in $AlN/SiO_2/Cu/36°$ Y—X $LiTaO_3$.

FIG. 20 shows simulation results of the electromechanical coupling coefficient k$^2$ and the temperature characteristic of frequency (TCF) when H$_2$, H$_3$/λ=0.05, H$_5$/λ=2.0 and further H$_4$ is changed in AlN/SiO$_2$/Cu/36° Y—X LiTaO$_3$. It is understood that the film thickness ratio H$_4$/λ when the TCF is zero is 0.6 and the electromechanical coupling coefficient k$^2$ at this time is about 0.06.

The invention claimed is:

1. An elastic boundary wave functional element comprising:
    a $LiNbO_3$ substrate;
    a film electrode formed above the $LiNbO_3$ substrate;
    a $SiO_2$ film formed above the film electrode; and
    a thin film formed above the $SiO_2$ film, the thin film having a transverse wave velocity larger than that of $SiO_2$ film,
    wherein the film electrode has a ratio $H_2/\lambda$ or $H_3/\lambda$ that is 0.05 or more, symbol $H_2$ representing a film thickness of the film electrode, symbol $\lambda$ representing the wavelength of the central frequency of the boundary wave,
    wherein the $SiO_2$ film has a ratio $H_4/\lambda$ that is 0.4 or more and 1 or less, symbol $H_4$ representing a film thickness of the $SiO_2$ film,
    wherein the thin film has a ratio $H_5/\lambda$, symbol $H_5$ representing a film thickness of the thin film,
    wherein the functional element is structured and arranged such that when an energy radiation exists in the thickness direction of the substrate, and
    an energy exists in the surface of the thin film,
    the energy radiation in the thickness direction of the substrate is ⅛ or less of the whole energy, and the energy of the surface of the thin film is ⅛ or less of the whole energy, and
    wherein SV wave energy is larger than SH wave energy at a boundary between the $LiNbO_3$ substrate and the $SiO_2$ film.

2. The elastic boundary wave functional element according to claim 1, wherein the film electrode is made from copper.

3. The elastic boundary wave functional element according to claim 1, wherein the $LiNbO_3$ substrate is a 120-136° rotated Y—X propagation $LiNbO_3$ substrate.

4. The elastic boundary wave functional element according to claim 1, wherein the ratio $H_5/\lambda$ is 1 or more and 2 or less.

* * * * *